United States Patent [19]

Stiegler et al.

[11] Patent Number: 5,786,702
[45] Date of Patent: Jul. 28, 1998

[54] METHOD FOR DETECTING DEFECTS IN INTEGRATED-CIRCUIT ARRAYS

[75] Inventors: Harvey J. Stiegler, Houston; Steven V. Krzentz, Dallas, both of Tex.

[73] Assignee: Texas Instruments Incorporated, Dallas, Tex.

[21] Appl. No.: 565,603

[22] Filed: Nov. 30, 1995

[51] Int. Cl.$^6$ .................................................. G01R 31/28
[52] U.S. Cl. ................................... 324/763; 371/22.5
[58] Field of Search ................................. 324/763, 765, 324/158.1; 371/21.1, 22.5, 22.6; 365/201

[56] References Cited

U.S. PATENT DOCUMENTS

5,285,150  2/1994  Henley et al. ..................... 324/158.1

*Primary Examiner*—Ernest F. Karlsen
*Attorney, Agent, or Firm*—Robby T. Holland; Richard L. Donaldson

[57] ABSTRACT

A method for detecting defects between parallel rows of conductors (ROW) in an integrated-circuit array (ARR) includes (a) connecting all alternate rows (ROW) of conductors of the array (ARR) to a first voltage ($V_{DD}$) and connecting the other alternate rows (ROW) of conductors of the array (ARR) to a second voltage ($V_{REF}$) different from the first voltage, while measuring the current drawn; (b) if the current does not exceed a first limit, ending the process; (c) if the current exceeds the first limit, separately repeating step (a) on first and second halves of the array rather than all of the array, with all of the rows (ROW) of conductors of the half of the array (ARR) not under test connected to the second voltage ($V_{REF}$); (d) if the current exceeds a second limit for a half of the array (ARR) in step (c), repeating step (a) on each quarter of the array (ARR) in that half with all of the rows (ROW) of the array (ARR) not under test connected to the second voltage $V_{REF}$; and (e) if the current exceeds a third limit for an array (ARR) quarter in step (d), continuing analogous steps for array (ARR) fractions divisible by two and for predetermined current limits until sufficient information concerning the defects is determined.

12 Claims, 4 Drawing Sheets

METHOD FOR DETECTING DEFECTS IN INTEGRATED-CIRCUIT ARRAYS

BACKGROUND OF THE INVENTION

This invention relates to integrated circuits and, in particular, to a method for detecting defects that allow undesired current flow between conductive elements of integrated-circuit arrays, including memories for storing digital data.

Memory arrays are typically a matrix of memory-cell transistors physically arranged in adjacent, parallel rows and in adjacent, parallel columns. Parallel conductive wordlines and parallel conductive bitlines, each separated by an insulator, provide electrical connection to the memory cells for reading and writing in the case of random-access memories; or for programming, reading and/or erasing in the case of nonvolatile memories such as EPROMs (Electrically Programmable Read-Only-Memories) and Flash EPROMs (Flash Electrically-erasable, Programmable Read-Only-Memories). One defect arising during manufacture is a short circuit (short) between adjacent wordlines or between adjacent bitlines. A wordline short may result, for example, from an etching process that leaves a filament of conducting material between wordlines formed from a single layer of that conducting material, which may be aluminum or doped polycrystalline silicon. A bitline short may result, for example, from any step in the process that leaves conducting material between bitlines, which may also be formed from an etched layer of aluminum or doped polycrystalline silicon. Other defects may short wordlines to bitlines, or may short either of these to the semiconductor substrate.

It is necessary to test memory arrays during manufacture to detect the presence or absence of these defects. Some shorts may have a sufficiently low resistance that none of the cells in the connected row or column are functional. Other shorts may have a sufficiently high resistance that the cells in the connected row or column are programmable (or writable) and readable, but those high-resistance shorts may result in poor reliability of, or in short life of, the memory array.

The memory cells of nonvolatile arrays, for example, are generally checked prior to packaging by applying programming voltages that tend to charge the floating gates of all of the memory cells. Charging a floating gate with electrons usually means storing a "zero" bit, sometimes meaning a "one" bit. The data stored in the cells are then read in a form that maps the pattern of any cells that do not indicate storage of a "zero" bit as a result of the programming operation. For example, certain patterns of cells that fail to program indicate the presence of low-resistance shorts between wordlines and/or bitlines. If a relatively small number of rows and/or columns of cells have defects, then those defective rows and/or columns are replaced with redundant rows and/or columns by using lasers, or electrical means such as nonvolatile memory cells, to activate fuses that reroute circuitry. While nonvolatile arrays are discussed here by way of example, similar tests are performed on random access and other memory types.

After correction to replace defective memory cells, it is often desirable to test such very-large-scale-integrated circuits for more subtle defects, such as defects that may pose long-term reliability problems. Such subtle defects include high-resistance, low-current paths. One method for testing for more subtle defects is known as $I_{DDQ}$ testing. As described herein, $I_{DDQ}$ testing looks for high-resistance defects by placing an electric field or potential difference across elements such as wordlines and/or bitlines that are separated by insulators. The current consumed is measured under those electric-field conditions. For example, $I_{DDQ}$ testing of memory arrays includes connecting alternate wordlines (or bitlines) to the power supply and connecting the remaining wordlines (or bitlines) to ground. Current consumption above a pre-set limit indicates the presence of at least one high-resistance short or other subtle defect that may cause marginal performance or that may later cause a reliability problem.

There is a problem caused when performing an $I_{DDQ}$ test after known low-resistance shorts have been repaired by replacement with redundant rows or columns of cells. That problem is related to the fact that the low-resistance shorts remain in the array even after the redundancy replacement. If a low-resistance defect exists and if that low-resistance defect has been repaired by replacing the affected cells with redundant cells, the only known way to "map out" the low-resistance defect during $I_{DDQ}$ testing is to test row-by-row or column-by-column, which is prohibitively slow because of the time required to charge the capacitance before measurement of current. On the other hand, if prior-art parallel methods are used to speed up the testing, the high current drawn by the "repaired" defect masks any additional undetected subtle defects, rendering those subtle defects undetectable.

In general, $I_{DDQ}$ testing is not used to find low-resistance shorts because $I_{DDQ}$ testing, when performed row-by-row, is much slower than using programmed-cell pattern testing described above.

A prior-art method for detecting wordline shorts is described in U.S. patent application Ser. No. 08/149,244 filed Oct. 26, 1993, pending, entitled CIRCUIT AND METHOD FOR DETECTING WORDLINE SHORTS IN INTEGRATED CIRCUIT MEMORIES, assigned to Texas Instruments Incorporated. That patent describes detection of the presence or absence of shorts between wordlines with a single measurement for the entire array. The special test circuit and method connect alternate wordlines to reference potential ($V_{REF}$ or ground) and connect the other alternate wordlines to a common bias-voltage terminal. With the even and odd numbered wordlines biased in this manner, any low-resistance path between wordlines is detected by measuring the current/voltage characteristic at the common terminal. The described procedure provides parallel detection in one reading of a short between any two adjacent wordlines. However, the patent does not disclose a way of determining where that short is located, and does not provide a way of working around the short, if the short has been repaired (two rows of cells replaced).

A prior-art bitline short-detection circuit and method is described in U.S. Pat. No. 5,392,246 issued Feb. 21, 1995 entitled CIRCUIT AND METHOD FOR DETECTING COLUMN-LINE SHORTS IN INTEGRATED-CIRCUIT MEMORIES, also assigned to Texas Instruments Incorporated. The short-detection circuit described in that patent includes a special test circuit that, for example, turns off all wordlines; includes a N-channel transistor for each bitline; includes a decoder that uses only the least significant column address for input; and includes a sensor to detect current between shorted conductors. However, that patent does not disclose a way of determining where a short is located, and does not describe a way of working around defects that have been repaired (columns of cells replaced). An advantage of the detection circuit described in that patent is the requirement for a very small number of transistors. The reason is that the detection circuit described in that patent uses only the least significant address as the input for the column decoder.

There is a need for a simple method for conducting $I_{DDQ}$ testing to detect high resistance paths between adjacent, parallel conductors, and to detect other defects, after the row and/or column locations of low-resistance shorts have been determined and after the affected rows and/or columns or such memory cells have been replaced with redundant rows and/or columns of memory cells. After $I_{DDQ}$ testing, the memory array may be discarded, classified according to quality, or the rows/columns of those cells adversely affected by marginal short circuits may be replaced with other rows/columns of redundant cells. There is also a need for a simple method for testing to detect the number of, and location of, high-resistance shorts and/or low-resistance shorts between adjacent, parallel conductors in integrated circuit memories.

SUMMARY OF THE INVENTION

This invention is applicable to any type of integrated circuit having rows and columns of conductive elements susceptible to both low-resistance and high-resistance current paths.

In a first aspect, this invention includes circuitry that independently disables multiple addresses to the decoding circuitry of a memory array. The circuit for disabling various addresses includes circuitry that, in response to signals indicating that certain addresses shall be "don't care" rather than "care", forces the output of appropriate address input and buffering circuitry to a logical "don't care" condition; and In a second aspect, this invention allows $I_{DDQ}$ testing of "repaired" memory arrays for the purpose of producing higher-quality memory arrays having improved reliability. That is, this invention permits "working around" known defects in a "repaired" memory array when performing $I_{DDQ}$ testing.

In a third aspect, this invention further detects the existence of, and/or determines the location of, low-resistance current paths and/or high-resistance current paths.

During the testing procedure of this invention, the first (circuitry) aspect of this invention selects individual addresses as either "cares" or "don't cares". The selected "don't care" addresses are chosen in a specific manner. The "care" addresses are sequenced in a particular manner that partitions the testing in a way that avoids drawing current through a known defect, thereby detecting only current that is drawn by previously undetected defects.

The second aspect, or method for detecting the existence of defects in the presence of other known defects, includes:

(a) connecting at least one maximum number of alternate rows of conductors of the array to a first voltage and connecting the maximum number of other alternate rows of conductors of the array to a second voltage different from the first voltage, the maximum numbers being the largest number of rows addressable without addressing one of the known defects; and;

(b) repeating step (a) for any equal maximum number of alternate rows of conductors and for the next smaller maximum numbers of alternate rows of conductors and alternate conductors until all of rows of the array except those with defects have been tested.

The third aspect, or method for detecting existence and location of defects, includes:

(a) connecting all alternate rows of conductors of the array to a first voltage and connecting the other alternate rows of conductors of the array to a second voltage different from the first voltage, while measuring current between the first voltage and second voltage;

(b) if the current does not exceed a first limit, ending the process;

(c) if the current exceeds the first limit, separately repeating step (a) on first and second halves of the array rather than all of the array, with all of the rows of conductors of the half of the array not under test connected to the second voltage;

(d) if the current exceeds a second limit for a half of the array in step (c), repeating step (a) on each quarter of the array in that half with all of the rows of the array not under test connected to the second voltage; and (e) if the current exceeds a third limit for an array quarter in step (d), continuing analogous steps for array fractions divisible by two and for predetermined current limits until sufficient information concerning the defects is determined.

In the second and third aspects of this invention, the alternate-row tests may be conducted on large parts of the array in non-adjacent segments, or partitions, such as the upper one-half of each of the upper and lower halves.

DETAILED DESCRIPTION OF THE INVENTION

The word "row" is hereby defined to include "column" in this detailed description and in the claims following this description. Similarly, any description relating to "wordlines" is understood to relate equally to "bitlines" or "column-lines".

Throughout this document, logic "high" is used to represent a "true" logic signal and logic "low" is used to represent a "false" logic signal.

Furthermore, the word "short" is defined to include any defect which may be detected by measuring (undesired) current flow, whether to an adjacent conductor, the semiconductor substrate, or other feature of the circuit.

Also, a "care" address is defined to be an address which performs its normal function in subsequent decoding circuitry. A "don't care" address is defined to be one which has been placed in a state such that subsequent decoding will not be disabled by that address; that is, subsequent decoding operations which match all other relevant addresses will match regardless of the input state of the "don't care" address.

A. First Aspect—Circuitry

The first aspect of the invention includes modification of address input or buffering circuitry in order to allow addresses relevant to a particular decoding operation to be placed selectively and independently into a "don't care" condition in response to control signals.

Figure 1:
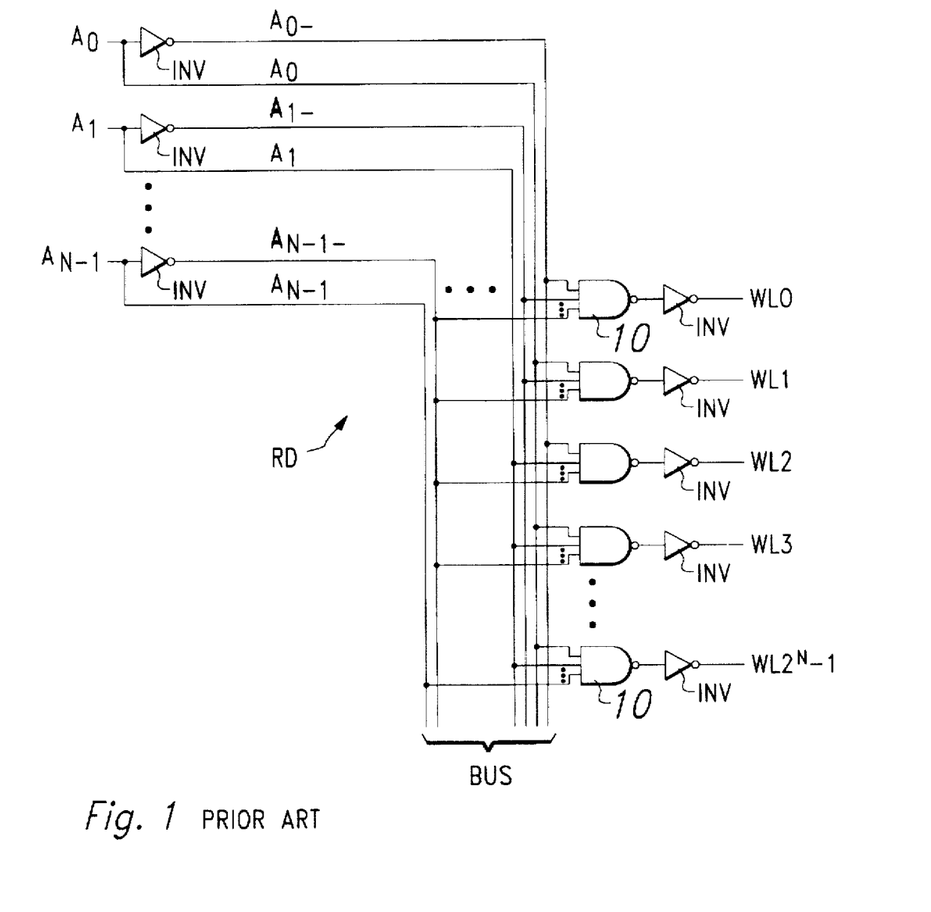
FIG. 1 is an electrical schematic diagram of an example prior-art row decoder.

Referring to FIG. 1, a prior-art row decoder RD for a memory array (not shown in FIG. 1) having $2^N$ rows, or wordlines WL, selected using input addresses $A_0, A_1, \ldots, A_{N-1}$ is illustrated. The row decoder RD is, for example, implemented as NAND gates 10 having outputs coupled to each wordline WL0, WL1, WL2, WL3, ..., WL$2^N-1$. The inputs of NAND gates 10 are coupled as shown through bus BUS to input addresses $A_0, A_1, \ldots, A_{N-1}$ and to the complements $A_{0\_}, A_{1\_}, \ldots, A_{N-1\_}$ of those input addresses $A_0, A_1, \ldots, A_{N-1}$. Each NAND gate 10, when connected in series with an inverter INV, becomes an AND gate.

Figure 2:
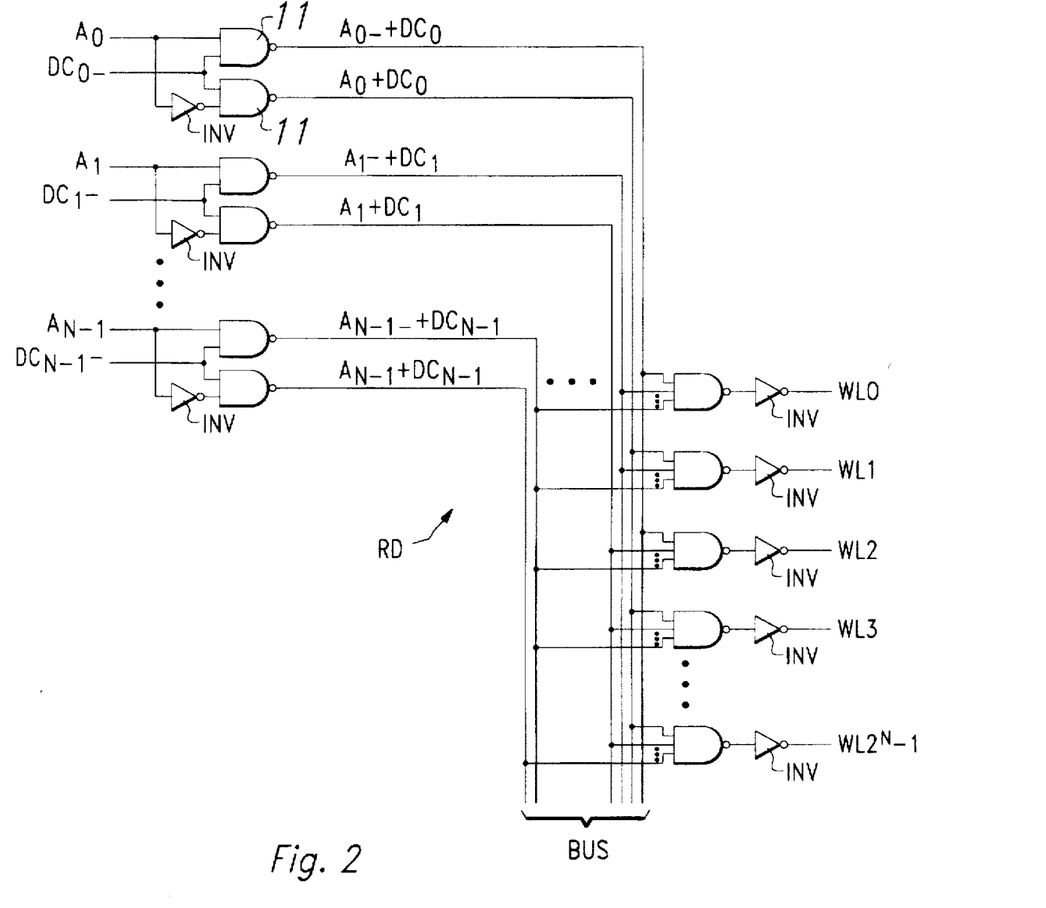
FIG. 2 is an electrical schematic diagram of the prior-art row decoder of FIG. 1 modified for use with the method of this invention.

Referring now to FIG. 2, the prior-art decoding circuit RD of FIG. 1 is modified to accomplish the method of this invention. The decoding circuit RD of FIG. 2 is used to detect defects in an integrated-circuit array. As in the circuit of FIG. 1, the decoding of FIG. 2 is coupled to row conductors WL0, WL1, WL2, WL3, ..., WL$2^N-1$ of the array. Also as in the circuit of FIG. 1, the decoding circuit of FIG. 2 is capable of furnishing one of either a high state or a low state at each row conductor WL0, WL1, WL2, WL3, ..., WL$2^N-1$ of the array. The decoding circuit of FIG. 2 includes a plurality of binary address inputs $A_0, A_1, \ldots, A_{N-1}$. Each binary address input comprising a combination of $A_0, A_1, \ldots, A_{N-1}$ corresponds to a row conductor WL0, WL1, WL2, WL3, ..., WL$2^N-1$, respectively, of the array. The decoding circuit of FIG. 2 also includes a control signal $DC_{0\_}, DC_{1\_}, \ldots, DC_{N-1\_}$ corresponding to each binary address input $A_0, A_1, \ldots, A_{N-1}$, respectively. Each binary address input $A_0, A_1, \ldots, A_{N-1}$ and each corresponding control signal $DC_{0\_}, DC_{1\_}, \ldots, DC_{N-1\_}$ is coupled to a logic circuit that forces the row conductor WL0, WL1, WL2, WL3, ..., WL$2^N-1$ corresponding to the particular binary address $A_0, A_1, \ldots, A_{N-1}$ to one of a high state or a low state regardless of the corresponding binary address input $A_0, A_1, \ldots, A_{N-1}$. In the example circuit of FIG. 2, the logic circuit comprises pairs of first and second NAND gates 11, an input of the first NAND circuit 11 coupled to a binary address input, an input of the second NAND gate 11 coupled to the inverse of that binary address input, an input of each of the first and second NAND gate coupled to the corresponding control signal, the outputs of the first and second NAND circuits coupled through bus BUS and an AND circuit 10, INV to the corresponding row conductor WL0, WL1, WL2, WL3, ..., WL$2^N-1$. The control signals $DC_{0\_}, DC_{1\_}, \ldots, DC_{N-1\_}$ may, for example, be coupled to the logic circuitry from a source external to the integrated-circuit array. In the decoder circuit RD of FIG. 2, a particular input address A, becomes a "don't care" by forcing both the true address A, and the complement addresses $A_{J\_}$ "high".

In the prior art described in the preceding Background section, one "don't care" control signal $DC_{J\_}$ is common to all input addresses $A_J$ except the lowest-order row input address $A_0$. This results in the alternate-wordlines-high behavior previously described.

In FIG. 2, each input address $A_J$ is individually capable of being made a "don't care". This may be accomplished by defining "don't care" signals $DC_{0\_}, \ldots, DC_{N-1\_}$ as a bus and, for example, deriving them from a source such as a bank of latches, or from a bank of high-voltage sensors attached to each input address $A_J$ pin, respectively.

Figure 3A:
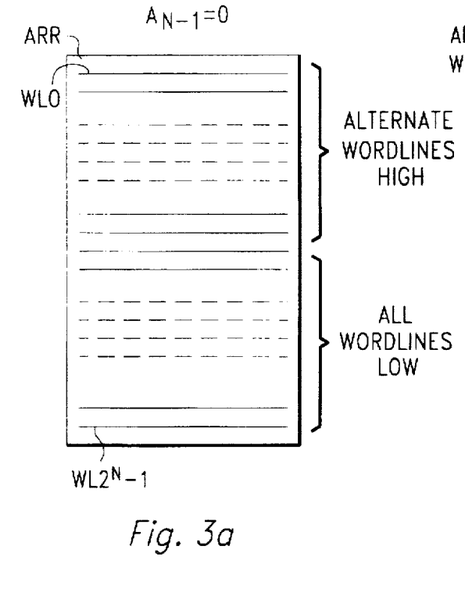
FIGS. 3(A) and 3(B) illustrate voltages on wordlines of an array with a particular set of addresses applied to the decoder of FIG. 2.
Figure 3B:
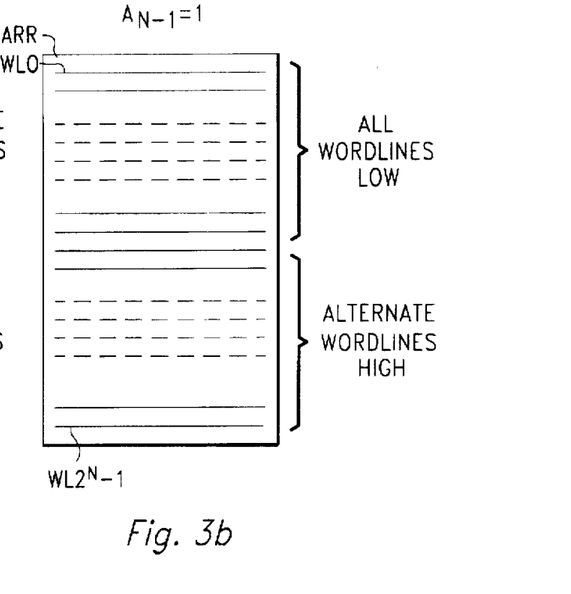
Figure 4A:
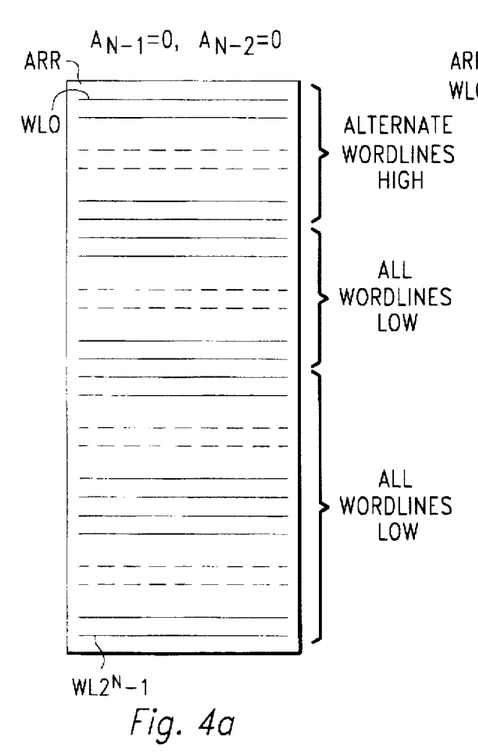
FIGS. 4(A)–4(D) illustrate voltages on wordlines of an array with particular addresses applied to the decoder of FIG. 2 to perform $I_{DDQ}$ testing on an array with known high-resistance current paths or to determine the type and location of unknown current paths.
Figure 4B:
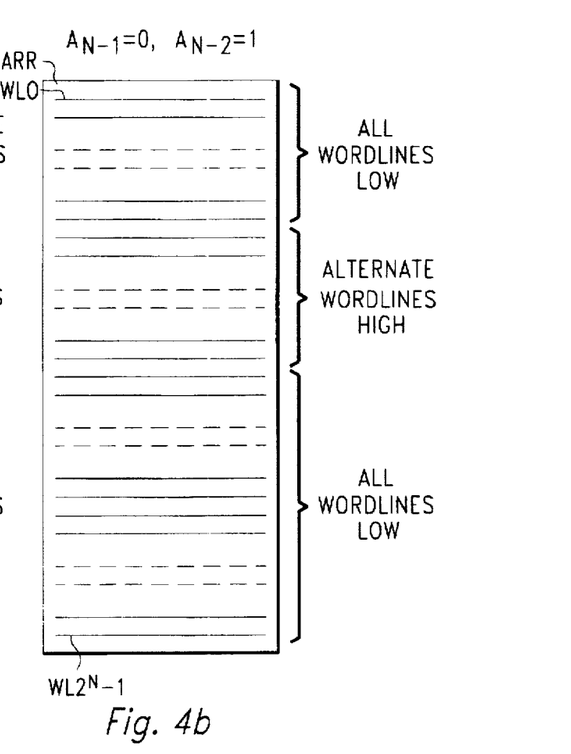
Figure 4C:
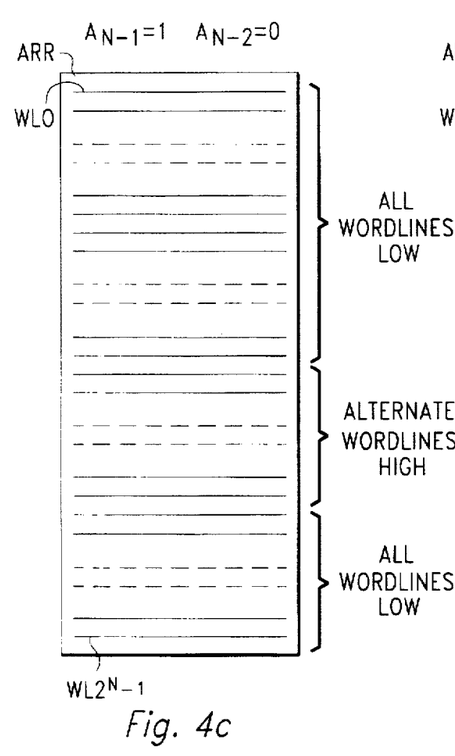
Figure 4D:
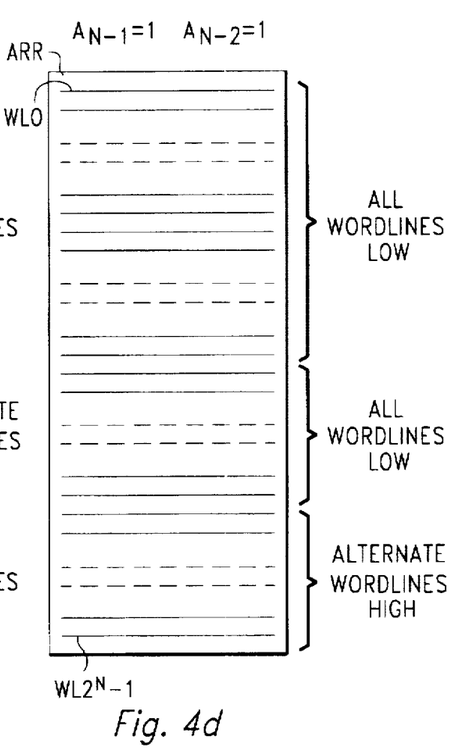

In the example of FIGS. 3(A) and 3(B), input addresses $A_1, \ldots, A_{N-2}$ to array ARR are made "don't care" by low signals $DC_{1\_}, \ldots, DC_{N-2\_}$, respectively, and only input addresses $A_0$ and $A_{N-1}$ are made "cares" by high signals $DC_{0\_}$ and $DC_{N-1\_}$, respectively. This results in alternate wordlines high behavior, but only in the half of the array selected by address $A_{N-1}$. As discussed below in relation to the second aspect of the invention, if the array is known to have low-resistance short(s) in one half only and the test is for high-resistance shorts only, this step in the $I_{DDQ}$ test for that half the array may be skipped. The $I_{DDQ}$ test for the remaining part of that half is performed during later steps.

Referring to FIGS. 4(A)–(D), representative wordlines ROW in array ARR are illustrated with $A_{N-2}, A_{N-1}$ and $A_0$ made "cares" by high signals $DC_{N-2\_}, DC_{N-1\_}$ and $DC_{0\_}$, respectively. Addresses $A_1, \ldots, A_{N-3}$ are made "don't cares" by low signals $DC_{1\_}, \ldots, DC_{N-3\_}$, respectively. This results in alternate rows high in the quadrant selected by addresses $A_{N-2}$ and $A_{N-1}$, and all rows low in the remaining three quadrants. As discussed below in relation to the second aspect of this invention, any quadrants not containing the short(s) found in the bias configuration of FIGS. 3(A) and 3(B) are tested for $I_{DDQ}$. Of course, if either half of the array ARR was found to be free of shorts during the first step, it is not necessary to test those quadrants again. However, those quadrants may be included for convenience without jeopardizing subsequent tests by making $A_{N-1}$ a "don't care" signal. It is, of course, understood that the bias arrangement of FIGS. 4(A)–(D) does not apply if quadrants are tested again by making, for example, $A_{N-1}$ a "don't care" signal.

B. Second Aspect—$I_{DDQ}$ Testing

Note that generally the number of low-resistance shorts is small because of the limited number of redundant cells. Therefore, in the test relating to FIGS. 3(A) and 3(B), the time-consuming $I_{DDQ}$ test is performed over a large part of the array even though shorted cells have been replaced by redundant cells.

Because a non-defective CMOS memory array draws very little current, the current drawn from the power supply during the test of this invention is a measure of current leakage. The method of this invention requires that criteria in the form of one or more test current limits be established. If the test is used to find high-resistance shorts, the current limits are relatively low. The current limits may vary depending on the number of wordlines energized, using a higher current limit where conductors are alternately-charged over the entire array, using lower current limits where fractions of the array have conductors at the same voltage. The current may be measured with no wordlines energized to determine actual junction leakage current, which may be added to the leakage current limits used herein. If the test is used to locate defective diffusions, the current limits may have a value determined by excessive current drawn by those defective diffusions.

The second aspect of the invention includes using the address input and buffering circuitry of the first aspect to test an array with known defects for additional high-resistance (low-current-consuming-) defects by avoiding current flow through the known defects. (If there are no known defects replaced by redundant elements, then the prior-art testing using alternate wordline or bitlines is sufficient.) Typically, known defects have been replaced by redundant elements. If prior-art parallel methods are used to test an array with replaced defects, the high current drawn by the "repaired" defect masks any additional high-resistance, or subtle defects, rendering those subtle defects undetectable. On the other hand, if $I_{DDQ}$ testing is performed row-by-row or column-by-column to "map out" the repaired defect, the test time is prohibitively long because of the time required to charge the capacitance before measurement of current.

The method for detecting the existence of defects in the presence of other known defects includes:

(a) connecting at least one maximum number of alternate rows of conductors of the array to a first voltage and connecting the maximum number of other alternate rows of conductors of the array to a second voltage different from the first voltage, the maximum numbers being the largest number of rows addressable without addressing one of the known defects; and (b) repeating step (a) for any equal maximum number of alternate rows of conductors and for the next smaller maximum numbers of alternate rows of conductors and alternate conductors until all of the rows of the array except those with defects have been tested. (This step may include additional groups of the smaller maximum numbers of alternate rows that may have already been tested.)

The maximum number of alternate rows of conductors is defined by the connections of the address signals $A_0, A_1, \ldots A_{N-1}$ to wordlines WL0, WL1, WL2, WL3, ..., WL2$^N$−1.

For example, if an array has a single known defect and has N addresses numbered $A_0$ to $A_{N-1}$, $2^N$ rows, an $I_{DDQ}$ test may be performed using the following steps:

(1) Select $A_{N-1}$ and $A_0$ to be "care" addresses, and the remainder of the addresses to be "don't care".

(a) If the known defect is in the array half addressed by $A_{N-1}=1$, then set $A_{N-1}=0$ and test $I_{DDQ}$ with either $A_0=0$ or $A_0=1$ or both, as desired.

(b) If the known defect is in the array half addressed by $A_{N-1}=0$, then set $A_{N-1}=1$ and test $I_{DDQ}$ with either $A_0=0$ or $A_0=1$ or both, as desired.

(c) If the known defect is on the boundary between array halves that are divided by $A_{N-1}$, then first set $A_{N-1}=A_0=0$ and test for $I_{DDQ}$, followed by a similar $I_{DDQ}$ test with $A_{N-1}=A_0=1$.

(2) For each address from $A_{N-2}$ to $A_1$ in turn, select one address in addition to $A_0$ to be a "care", and the remaining addresses to be "don't cares". Repeat step (1) substituting the selected address for $A_{N-1}$. Note that "array half addressed by $A_{N-1}$" will become "an array quadrant addressed by $A_{N-1}$ and $A_{N-2}$, (or two quadrants addressed by $A_{N-2}$, if the test includes previously tested quadrants)", "an array octant addressed by $A_{N-1}$, $A_{N-2}$ and $A_{N-3}$ (or four array octants addressed by $A_{N-3}$, if the test includes octants that have been previously tested)", etc.

If an array has two known defects and has N addresses numbered $A_0$ to $A_{N-1}$, $2^N$ rows, an $I_{DDQ}$ test may be performed using the following steps:

(1) From the addresses $A_{n-1}$ through $A_1$, select an address that distinguishes between the two known defects. That is, select an address $A_K$ such that $A_K=0$ to address one of the defects and $A_K=1$ to address the other defect.

(2) Select $A_K$ to be a "care" address. If $A_K$ is not $A_{N-1}$, then also select $A_{N-1}$ and $A_0$ to be "care" addresses, and the remainder of the addresses to be "don't care". If $A_K$ is $A_{N-1}$, then begin with $A_{N-2}$ and $A_0$ as the "care" addresses in addition to $A_K$.

(a) Select $A_K=0$ and perform the following steps:

(i) If the known defect addressed by $A_K=0$ is in the array half addressed by $A_{N-1}=1$, then set $A_{N-1}=0$ and test $I_{DDQ}$ with either $A_0=0$ or $A_0=1$ or both, as desired.

(ii) If the known defect addressed by $A_K=0$ is in the array half addressed by $A_{N-1}=0$, then set $A_{N-1}=1$ and test $I_{DDQ}$ with either $A_0=0$ or $A_0=1$ or both, as desired.

(iii) If the known defect addressed by $A_K=0$ is on the boundary between array halves that are divided by $A_{N-1}$, then first set $A_{N-1}=A_0=0$ and test for $I_{DDQ}$ followed by a similar $I_{DDQ}$ test with $A_{N-1}=A_0=1$.

(b) Select $A_K=1$ and perform the following steps:

(i) If the known defect addressed by $A_K=1$ is in the array half addressed by $A_{N-1}=1$, then set $A_{N-1}=0$ and test $I_{DDQ}$ with either $A_0=0$ or $A_0=1$ or both, as desired.

(ii) If the known defect addressed by $A_K=1$ is in the array half addressed by $A_{N-1}=0$, then set $A_{N-1}=1$ and test $I_{DDQ}$ with either $A_0=0$ or $A_0=1$ or both, as desired.

(iii) If the known defect addressed by $A_K=1$ is on the boundary between array halves that are divided by $A_{N-1}$, then first set $A_{N-1}=A_0=0$ and test for $I_{DDQ}$, followed by a similar $I_{DDQ}$ test with $A_{N-1}=A_0=1$.

(3) For each address from $A_{N-2}$ to $A_1$ in turn except $A_K$, select one address in addition to $A_0$ and $A_K$ to be a "care", and the remaining addresses to be "don't cares". Repeat step (2) substituting the selected address for $A_{N-1}$.

Again, the maximum number of alternate rows of conductors is defined by the connections of the address signals $A_0, A_1, \ldots, A_{N-1}$ to wordlines WL0, WL1, WL2, WL3, ... WL2$^N$−1.

If an array has two known defects and has N addresses numbered $A_0$ to $A_{N-1}$, $2^N$ rows, an $I_{DDQ}$ test may, alternatively, be performed using the following steps:

(1) Select $A_{N-1}$ and $A_0$ to be care addresses. If neither known defect is in the half of the array in which $A_{N-1}=0$, and there also is no known defect at the boundary between the two half-arrays, then test that half of the array, with $A_{N-1}=0$ and $A_0=1$. If there is a known defect at the boundary, then instead use $A_{N-1}=A_0=0$.

(2) If neither known defect is in the half with $A_{N-1}=1$, and there also is no known defect at the boundary between the two half-arrays, then test that half, with $A_{N-1}=1$ and $A_0=0$. If there is a known defect at the boundary, then instead use $A_{N-1}=A_0=1$.

(3) If, there is one known short for one state of $A_{N-1}$ and the other bridges the boundary between the two half arrays selected by $A_{N-1}$, then there is one state of $A_{N-1}$ for which there is one known defect. The other half has no known defect and has already been tested. To test the half that has not yet been tested, and has one known short, take $A_{N-1}$ to the state that selects that half array. Also, set $A_0=A_{N-1}$. Now, test this half-array exactly as for the case of one known short, since this half-array is, in fact, equivalent to a full array with one known short. That is, start with $A_{N-2}$ and $A_0$ (in addition to $A_{N-1}$) as cares. Then use $A_{N-3}$ and $A_0$ (plus, of course, $A_{N-1}$), and after that $A_{n-4}$ and $A_0$ (plus $A_{N-1}$), etc.

(4) If, however, there is one known defect for each state of $A_{N-1}$, then:

(a) With $A_{N-1}=0$, test this half of the array exactly as is done for the case of one known short, using addresses $A_{N-2}$ through $A_0$. That is, start with $A_{N-2}$ and $A_0$ (in addition to $A_{N-1}$, which is being held low) as cares, and then use $A_{N-3}$ and $A_0$, and then $A_{N-4}$ and $A_0$, etc.

(b) Repeat the above, but now with $A_{N-1}=1$.

(5) If there is one state of $A_{N-1}$ that contains both known defects, then ignore $A_{N-1}$ completely, and decrement N, so that what was $A_{N-2}$ now is called $A_{N-1}$. Now, go to Step (1).

Again, the maximum number of alternate rows of conductors is defined by the connections of the address signals $A_0, A_1, \ldots, A_{N-1}$ to wordlines WL0, WL1, WL2, WL3, . . . WL$2^N-1$.

If an array has M known defects and has N addresses numbered $A_0$ to $A_{N-1}$, $2^N$ rows, an $I_{DDQ}$ test may be performed by extending the above procedure to allow for M "care" addresses in addition to $A_0$. M−1 of the "care" addresses are used to distinguish between the multiple defects, and $A_0$ and the remaining "care" address are employed in the method of the case with only one known defect to test the array. In certain special cases fewer than M−1 "care" addresses may distinguish between M defects; however, in the general case M−1 "care" addresses are required.

C. Third Aspect—Detecting Type and Location of Defects

Again, because a non-defective CMOS memory array draws very little current, the current drawn from the power supply during the test of this invention is a measure of current leakage. The method of this invention requires that criteria in the form of one or more test current limits be established. If the test is used to find high-resistance shorts, the current limits are relatively low. If the test is used to find low-resistance shorts, the current limits are relatively high. In either case, the current limits may vary depending on the number of wordlines energized, using a higher current limit where conductors are alternately-charged over the entire array, using lower current limits where fractions of the array have conductors at the same voltage. The current may be measured with no wordlines energized to determine actual junction leakage current, which may be added to the leakage current limits used herein.

In the third aspect of the invention, the address input and buffering circuitry referred to in the above discussion of the first aspect above is used to determine the number and location of defects within an array with N address inputs numbered $A_0$ to $A_{N-1}$ and $2^N$ rows, provided the number of defects does not exceed N−2, by performing the following steps:

(1) Select $A_0$ as a "care" address, select the remaining addresses as "don't care", and measure the current.
   (a) If the current does not exceed a predetermined limit, there are no defects in the array and testing ceases.
   (b) If the current exceeds a predetermined limit, there is at least one defect in the array.
(2) Select $A_{N-1}$ and $A_0$ to be "care" addresses, and the remainder of the addresses to be "don't care".
   (a) Select $A_{N-1}=A_0=0$ and measure the current. If the current exceeds a predetermined limit, there is at least one defect in the array half addressed by $A_{N-1}=0$.
   (b) Select $A_{N-1}=A_0=1$ and measure the current. If the current exceeds a predetermined limit, there is at least one defect in the array half addressed by $A_{N-1}=1$.
   (c) If the current in neither (a) nor (b) exceeds the predetermined current limit, then select the remaining two logical combinations of $A_{N-1}$ and $A_0$ and measure the current for each. One of these two combinations should exceed the current limit indicating either a defect in the exact center between the halves addressed by $A_{N-1}=0$ and $A_{N-1}=1$ or a rectifying-type defect in one half of the array. If the testing procedure is concerned with rectifying-type shorts between wordlines, then adjacent wordlines must be energized in opposite directions. One procedure for testing for rectifying-type shorts is to apply voltages as follows. For example, if $A_{N-1}$ is a care address, choose $A_0=A_{N-1}$. Otherwise, choose $A_0$ to be the opposite state as the most-significant care-address. In fact, in some cases where there are two or more care addresses (plus $A_0$), the state of $A_0$ would not matter, because the boundary between the upper and lower half arrays is far from any biased wordlines.
   (d) If only one of (a) and (b) draws excessive current, then all potential defects must have the same state of $A_{N-1}$ in their address; note this state and allow $A_{N-1}$ to be either this state or "don't care" for the remainder of the testing.
   (e) If both (a) and (b) drew excessive current, then there are at least two defects and they are in separate halves of the array as divided by $A_{N-1}$. It is then necessary for $A_{N-1}$ to remain a "care" address for the remainder of the testing. Perform the following steps twice, one time for $A_{N-1}=0$ and one time for $A_{N-1}=1$.

(3) For each address from $A_{N-2}$ to $A_1$ in turn, select one address to be a "care" in addition to $A_0$ and possibly higher order addresses determined in the previous step(s) as mandatory "cares". Select the remaining addresses to be "don't cares". Repeat step (2) substituting the selected address for $A_{N-1}$. As each address from $A_{N-2}$ to $A_1$ is considered in turn note each address state that addresses a defect, as well as addresses that become mandatory "cares" in succeeding steps.

When all addresses have been used, information is sufficient to locate all defects.

As stated previously, the concepts are described in relation to wordlines or rows, but are equally applicable to columns, provided a type of power-supply-derived bias (high) is applied to alternating columns. It is also possible to apply these concepts to other logic circuits having sufficiently regular arrays, provided that the logic circuits are decoded in a suitable way and that the logic circuits make use of selective disablement or redundant circuit substitution.

While the invention has been described with reference to illustrative embodiments, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. A method for detecting defects between adjacent parallel rows of conductors in an integrated-circuit array, said method comprising:
   (a) connecting all alternate rows of conductors of said array to a first voltage and connecting the other alternate rows of conductors of said array to a second voltage different from said first voltage, while measuring the current between said first voltage and said second voltage;
   (b) if said current does not exceed a first limit, ending said process;
   (c) if said current exceeds said first limit, separately repeating step (a) on first and second halves of said array rather than all of said array, with all of the rows of conductors of the half of said array not under test connected to said second voltage;
   (d) if said current exceeds a second limit for a said half of said array in step (c), repeating step (a) on each quarter of said array in said half rather than all of said array, with all of the rows of said array not under test connected to said second voltage; and (e) if said current exceeds a third limit for a said quarter of said array in step (d), repeating step (a) on each one-eighth of said array in said quarter rather than all of said array, with all of the rows of said array not under test connected to said second voltage.

2. The method of claim 1, further comprising analogous steps for array fractions divisible by two and for predetermined current limits until sufficient information concerning said defects is determined.

3. The method of claim 1, wherein said integrated-circuit array is a nonvolatile memory.

4. The method of claim 1, wherein said rows of conductors are wordline conductors.

5. The method of claim 1, wherein said rows of conductors are bitline conductors.

6. The method of claim 1, wherein said first voltage is the voltage at one terminal of a supply voltage and said second voltage is the voltage at a second terminal of said supply voltage.

7. The method of claim 1, wherein said first voltage is the voltage at one terminal of a supply voltage and said second voltage is the voltage at a second terminal of said supply voltage, and wherein said current is the current measured through said supply voltage.

8. The method of claim 1, wherein said current limits are related to currents through low-resistance shorts between adjacent conductors of said parallel rows of conductors.

9. The method of claim 1, wherein said current limits are related to currents through high-resistance shorts between adjacent conductors of said parallel rows of conductors.

10. The method of claim 1, wherein said current limits are related to currents through high-resistance shorts between adjacent conductors of said parallel rows of conductors and wherein steps for determining current through low-resistance shorts are omitted.

11. The method of claim 1, wherein said current limits are the same.

12. The method of claim 1, wherein said test is ended any said current limit is exceeded.

* * * * *